(12) United States Patent
Wagner et al.

(10) Patent No.: US 12,374,633 B2
(45) Date of Patent: Jul. 29, 2025

(54) LAMINATE SUBSTRATE FOR INTEGRATED DEVICE PACKAGES

(71) Applicant: Analog Devices, Inc., Wilmington, MA (US)

(72) Inventors: Clement Joseph Wagner, Maynard, MA (US); Micah Galletta O'Halloran, Andover, MA (US)

(73) Assignee: Analog Devices, Inc., Wilmington, MA (US)

( * ) Notice: Subject to any disclaimer, the term of this patent is extended or adjusted under 35 U.S.C. 154(b) by 431 days.

(21) Appl. No.: 18/059,916

(22) Filed: Nov. 29, 2022

(65) Prior Publication Data

US 2023/0170313 A1 Jun. 1, 2023

Related U.S. Application Data

(60) Provisional application No. 63/284,581, filed on Nov. 30, 2021.

(51) Int. Cl.
| | |
|---|---|
| *H01L 21/00* | (2006.01) |
| *H01L 21/48* | (2006.01) |
| *H01L 21/56* | (2006.01) |
| *H01L 23/00* | (2006.01) |
| *H01L 23/498* | (2006.01) |

(52) U.S. Cl.
CPC ........ *H01L 23/562* (2013.01); *H01L 21/4857* (2013.01); *H01L 21/563* (2013.01); *H01L 23/49822* (2013.01); *H01L 24/16* (2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 8,242,583 B2* | 8/2012 | Yune | H01L 21/31053 438/666 |
| 9,673,214 B2* | 6/2017 | Hatano | H01L 23/585 |
| 9,824,988 B1* | 11/2017 | Lee | H01L 23/562 |
| 2010/0155904 A1* | 6/2010 | Yune | H01L 21/31053 438/700 |
| 2014/0189625 A1* | 7/2014 | Huang | H10D 84/903 716/111 |
| 2017/0103995 A1* | 4/2017 | Hatano | H10B 41/30 |
| 2017/0162613 A1* | 6/2017 | Karni | H01L 24/81 |

(Continued)

*Primary Examiner* — Nicholas J Tobergte
(74) *Attorney, Agent, or Firm* — Knobbe, Martens, Olson & Bear, LLP

(57) ABSTRACT

A laminate substrate panel may include an upper layer at or near a top surface of the panel. The laminate substrate panel may include a lower layer at or near a bottom surface of the panel. The laminate substrate panel may also include an array of functional laminate cells, each functional laminate cell of the array having a first upper pattern in the upper layer and a first lower pattern in the lower layer. The laminate substrate panel may also include a dummy laminate cell adjacent the array of functional laminate cells, the dummy laminate cell having a second upper pattern in the upper layer and a second lower pattern in the lower layer, the second upper and lower patterns configured to compensate for at least one of an opposing layer area density mismatch and a material density in at least one of the first upper and lower patterns.

20 Claims, 3 Drawing Sheets

(56) References Cited

U.S. PATENT DOCUMENTS

| | | | |
|---|---|---|---|
| 2019/0006341 A1* | 1/2019 | Lin | H01L 21/563 |
| 2020/0364315 A1* | 11/2020 | Chang | G06F 30/392 |
| 2021/0091013 A1* | 3/2021 | Höhenberger | H01L 23/564 |
| 2023/0067350 A1* | 3/2023 | Yew | H01L 21/563 |

* cited by examiner

LAMINATE SUBSTRATE FOR INTEGRATED DEVICE PACKAGES

CROSS-REFERENCE TO RELATED APPLICATIONS

The present application claims priority benefit under 35 U.S.C. § 119(e) to U.S. Provisional Patent Application Ser. No. 63/284,581, filed Nov. 30, 2021, titled LAMINATE SUBSTRATE FOR INTEGRATED DEVICE PACKAGES, hereby incorporated by reference herein.

BACKGROUND OF THE INVENTION

Integrated device packages can include a laminate package substrate (such as a printed circuit board, or PCB) and an integrated device die mounted to the package substrate. It can be important to ensure that the laminate package substrate is structured so as to avoid excessive stresses and to allow for high resolution patterning. For example, in various applications, stresses induced in the package substrate may cause warping. Accordingly, there remains a continuing need for improved integrated device packages.

SUMMARY OF THE INVENTION

Various embodiments disclosed herein use selectively placed and structured dummy (nonfunctional) laminate cells in a laminate panel as part of an array of functional laminates in order to meet minimum material density requirements and reduce material density mismatches on opposing sides of a substrate. The disclosed embodiments can significantly increase component density on the functional laminate's layout, while avoiding panel warpage due to opposing layer density mismatch and avoiding reduction in feature resolution due to insufficient metal density. The constraints involved can include layer density and opposing layer balancing. Layer density can include a desired material density (e.g., a desired metal density or insulating material density, by surface area) in various layers of a laminate panel, whereas opposing layer balancing can refer to a desired degree of material area density matching on opposing layers of a laminate panel.

In some embodiments, a laminate substrate panel includes an upper layer at or near a top surface of the panel; a lower layer at or near a bottom surface of the panel; an array of functional laminate cells, each functional laminate cell of the array having a first upper pattern in the upper layer and a first lower pattern in the lower layer; and a dummy laminate cell adjacent the array of functional laminate cells, the dummy laminate cell having a second upper pattern in the upper layer and a second lower pattern in the lower layer, the second upper and lower patterns configured to compensate for at least one of an opposing layer area density mismatch and a material density in at least one of the first upper and lower patterns.

The laminate substrate panel of any of any preceding paragraph and/or any of the laminate substrate panels disclosed herein can include one or more of the following features. In some aspects, the techniques described herein relate to a laminate substrate panel, further including a core layer wherein the first and second upper and lower layers are disposed on opposite sides of the core layer. The first and second upper and lower patterns can include one or more patterned insulating or metal layers. An amount of material of the first upper layer can be less than an amount of material of the first lower layer. The material of the first upper and lower layers can include a metallic or insulating material. An amount of metal of the first upper layer can be less than an amount of metal of the first lower layer. An amount of insulating material of the first upper layer can be less than an amount of insulating material of the first lower layer. An amount of metal of the second upper layer can be greater than an amount of metal of the second lower layer. The one or more insulating layers of the first and second upper patterns can include a solder mask layer with openings defining a die pad. The one or more insulating layers of the first and second lower patterns can include a solder mask layer exposing terminals to connect to solder balls. The laminate substrate panel can include a cured epoxy material. The number of functional cells of the array can be greater than the number of dummy laminate cells. The number of functional cells of the array can be at least three times the number of dummy laminate cells. The panel can receive an integrated device die. The laminate substrate panel can include more than one array of functional laminate cells. The substrate panel can include more than one dummy laminate cell.

In some aspects, the opposing layer area density mismatch between the first upper and lower patterns can be greater than 25% of a total area of the laminate substrate. The opposing layer area density mismatch between the first upper and lower patterns is greater than 30% of a total area of the laminate substrate. The opposing layer area density mismatch between the first upper and lower patterns can be greater than 35% of a total area of the laminate substrate. The opposing layer area density mismatch between the first upper and lower patterns can be greater than 40% of a total area of the laminate substrate. The opposing layer area density mismatch between the first upper and lower patterns can be greater than 45% of a total area of the laminate substrate. The opposing layer area density mismatch between the first upper and lower patterns can be greater than 50% of a total area of the laminate substrate. The opposing layer area density mismatch between the first upper and lower patterns can be greater than 60% of a total area of the laminate substrate. The opposing layer area density mismatch between the first upper and lower patterns can be greater than 70% of a total area of the laminate substrate. The opposing layer area density mismatch between the first upper and lower patterns can be greater than 80% of a total area of the laminate substrate. The opposing layer area density mismatch between the first upper and lower patterns can be greater than 90% of a total area of the laminate substrate. In some aspects, the opposing layer area density mismatch between the first upper and lower patterns can be between 25% and 100% of a total area of the laminate substrate. The opposing layer area density mismatch between the first upper and lower patterns can be between 30% and 100% of a total area of the laminate substrate. The opposing layer area density mismatch between the first upper and lower patterns can be between 35% and 100% of a total area of the laminate substrate. The opposing layer area density mismatch between the first upper and lower patterns can be between 40% and 100% of a total area of the laminate substrate. The opposing layer area density mismatch between the first upper and lower patterns can be between 45% and 100% of a total area of the laminate substrate. The opposing layer area density mismatch between the first upper and lower patterns can be between 50% and 100% of a total area of the laminate substrate. The opposing layer area density mismatch between the first upper and lower patterns can be between 55% and 100% of a total area of the laminate substrate. The opposing layer area density mismatch between the first upper and lower patterns can be between 60% and 100% of a total area of the laminate substrate. The opposing layer area density mismatch between the first upper and lower patterns can be between 65% and 100% of a total area of the laminate substrate. The opposing layer area density mismatch between the first upper and lower patterns can be between 70% and 100% of a total area of the laminate substrate. The opposing layer area density mismatch between the first upper and lower patterns can be between 75% and 100% of a total area of the laminate substrate. The opposing layer area density mismatch between the first upper and lower patterns can be between 80% and 100% of a total area of the laminate substrate. The opposing layer area density mismatch between the first upper and lower patterns can be between 85% and 100% of a total area of the laminate substrate. The opposing layer area density mismatch between the first upper and lower patterns can be between 90% and 100% of a total area of the laminate substrate. The opposing layer area density mismatch between the first upper and lower patterns can be between 95% and 100% of a total area of the laminate substrate.

In some aspects, the material density in at least one of the first upper and lower patterns can be less than 10%. The material density in at least one of the first upper and lower patterns can be less than 20%. The material density in at least one of the first upper and lower patterns can be less than 30%. The material density in at least one of the first upper and lower patterns can be less than 40%. The material density in at least one of the first upper and lower patterns can be less than 50%. The material density in at least one of the first upper and lower patterns can be between 0% and 5%. The material density in at least one of the first upper and lower patterns can be between 0% and 10%. The material density in at least one of the first upper and lower patterns can be between 0% and 15%. The material density in at least one of the first upper and lower patterns can be between 0% and 20%. The material density in at least one of the first upper and lower patterns can be between 0% and 25%. The material density in at least one of the first upper and lower patterns can be between 0% and 30%. The material density in at least one of the first upper and lower patterns can be between 0% and 35%. The material density in at least one of the first upper and lower patterns can be between 0% and 40%. The material density in at least one of the first upper and lower patterns can be between 0% and 45%. The material density in at least one of the first upper and lower patterns can be between 0% and 50%.

In some cases, a method for manufacturing a laminate substrate panel can include forming an upper layer on an upper side of a core layer; forming a lower layer on a lower side of the core layer; forming an array of functional laminate cells, each functional laminate cell of the array having a first upper pattern in the upper layer and a first lower pattern in the lower layer; and forming a dummy laminate cell adjacent the array of functional laminate cells, the dummy laminate cell having a second upper pattern in the upper layer and a second lower pattern in the lower layer, the second upper and lower patterns configured to compensate for at least one of an opposing layer area density mismatch and a material density in at least one of the first upper and lower patterns.

In some aspects, the laminate substrate panel includes a cured epoxy material. In some aspects, the steps of forming an array of functional laminate cells and a dummy laminate cell include forming at least three functional laminate cells for every dummy laminate cell. In some aspects, the number of functional laminate cells of the array is greater than the number of dummy laminate cells. In some aspects, the method includes mounting an integrated device die to the laminate substrate panel. In some aspects, the step of mounting the integrated device die to the laminate substrate panel includes forming a patterned solder mask defining a plurality of bond pads on the first and second upper layers of the laminate substrate panel; connecting the integrated device die with the bond pads of the upper layer of the laminate substrate panel by way of an interconnect; and disposing a molding compound over the integrated device die. In some aspects, the interconnect includes a plurality of solder bumps, a plurality of copper pillars, a plurality of wire bonds, and/or other interconnect technology.

In some aspects, the opposing layer area density mismatch between the first upper and lower patterns can be greater than 25% of a total area of the laminate substrate. In some aspects, the opposing layer area density mismatch between the first upper and lower patterns can be greater than 30% of a total area of the laminate substrate. In some aspects, the opposing layer area density mismatch between the first upper and lower patterns can be greater than 35% of a total area of the laminate substrate. In some aspects, the opposing layer area density mismatch between the first upper and lower patterns can be greater than 40% of a total area of the laminate substrate. In some aspects, the opposing layer area density mismatch between the first upper and lower patterns can be greater than 45% of a total area of the laminate substrate. In some aspects, the opposing layer area density mismatch between the first upper and lower patterns can be greater than 50% of a total area of the laminate substrate. In some aspects, the opposing layer area density mismatch between the first upper and lower patterns can be greater than 60% of a total area of the laminate substrate. In some aspects, the opposing layer area density mismatch between the first upper and lower patterns can be greater than 70% of a total area of the laminate substrate. In some aspects, the opposing layer area density mismatch between the first upper and lower patterns can be greater than 80% of a total area of the laminate substrate. In some aspects, the opposing layer area density mismatch between the first upper and lower patterns can be greater than 90% of a total area of the laminate substrate. In some aspects, the opposing layer area density mismatch between the first upper and lower patterns can be between 25% and 100% of a total area of the laminate substrate. In some aspects, the opposing layer area density mismatch between the first upper and lower patterns can be between 30% and 100% of a total area of the laminate substrate. In some aspects, the opposing layer area density mismatch between the first upper and lower patterns can be between 35% and 100% of a total area of the laminate substrate. In some aspects, the opposing layer area density mismatch between the first upper and lower patterns can be between 40% and 100% of a total area of the laminate substrate. In some aspects, the opposing layer area density mismatch between the first upper and lower patterns can be between 45% and 100% of a total area of the laminate substrate. In some aspects, the opposing layer area density mismatch between the first upper and lower patterns can be between 50% and 100% of a total area of the laminate substrate. In some aspects, the opposing layer area density mismatch between the first upper and lower patterns can be between 55% and 100% of a total area of the laminate substrate. In some aspects, the opposing layer area density mismatch between the first upper and lower patterns can be between 60% and 100% of a total area of the laminate substrate. In some aspects, the opposing layer area density mismatch between the first upper and lower patterns can be between 65% and 100% of a total area of the laminate substrate. In some aspects, the opposing layer area density mismatch between the first upper and lower patterns can be between 70% and 100% of a total area of the laminate substrate. In some aspects, the opposing layer area density mismatch between the first upper and lower patterns can be between 75% and 100% of a total area of the laminate substrate. In some aspects, the opposing layer area density mismatch between the first upper and lower patterns can be between 80% and 100% of a total area of the laminate substrate. In some aspects, the opposing layer area density mismatch between the first upper and lower patterns can be between 85% and 100% of a total area of the laminate substrate. In some aspects, the opposing layer area density mismatch between the first upper and lower patterns can be between 90% and 100% of a total area of the laminate substrate. In some aspects, the opposing layer area density mismatch between the first upper and lower patterns can be between 95% and 100% of a total area of the laminate substrate.

In some aspects, the material density in at least one of the first upper and lower patterns can be less than 10%. In some aspects, the material density in at least one of the first upper and lower patterns can be less than 20%. the material density in at least one of the first upper and lower patterns is less than 30%. In some aspects, the material density in at least one of the first upper and lower patterns can be less than 40%. In some aspects, the material density in at least one of the first upper and lower patterns can be less than 50%. In some aspects, the material density in at least one of the first upper and lower patterns can be between 0% and 5%. In some aspects, the material density in at least one of the first upper and lower patterns can be between 0% and 10%. In some aspects, the material density in at least one of the first upper and lower patterns can be between 0% and 15%. In some aspects, the material density in at least one of the first upper and lower patterns can be between 0% and 20%. In some aspects, the material density in at least one of the first upper and lower patterns can be between 0% and 25%. In some aspects, the material density in at least one of the first upper and lower patterns can be between 0% and 30%. In some aspects, the material density in at least one of the first upper and lower patterns can be between 0% and 35%. In some aspects, the material density in at least one of the first upper and lower patterns can be between 0% and 40%. In some aspects, the material density in at least one of the first upper and lower patterns can be between 0% and 45%. In some aspects, the material density in at least one of the first upper and lower patterns can be between 0% and 50%.

In some aspects, an integrated device package can include a laminate substrate having an upper layer at or near a top surface of the laminate substrate and a lower layer at or near a bottom surface of the laminate substrate, wherein an opposing layer area density mismatch between the upper and lower layers is greater than 25% of a total area of the laminate substrate; and an integrated device die mounted to the laminate substrate.

The integrated device package of any of any preceding paragraph and/or any of integrated device packages disclosed herein can include one or more of the following features. In some aspects, the opposing layer area density mismatch between the upper and lower layers can be greater than 30% of a total area of the laminate substrate. In some aspects, the opposing layer area density mismatch between the upper and lower layers can be greater than 35% of a total area of the laminate substrate. In some aspects, the opposing layer area density mismatch between the upper and lower layers can be greater than 40% of a total area of the laminate substrate. In some aspects, the opposing layer area density mismatch between the upper and lower layers can be greater than 45% of a total area of the laminate substrate. In some aspects, the opposing layer area density mismatch between the upper and lower layers can be greater than 50% of a total area of the laminate substrate. In some aspects, the opposing layer area density mismatch between the upper and lower layers can be greater than 60% of a total area of the laminate substrate In some aspects, the opposing layer area density mismatch between the upper and lower layers can be greater than 70% of a total area of the laminate substrate. In some aspects, the opposing layer area density mismatch between the upper and lower layers can be greater than 80% of a total area of the laminate substrate. In some aspects, the opposing layer area density mismatch between the upper and lower layers can be greater than 90% of a total area of the laminate substrate.

In some aspects, the upper layer of the laminate substrate has a first pattern including a first area of metallization and a first area of insulating material, and the lower layer of the laminate substrate has a second pattern including a second area of metallization and a second area of insulating material. In some aspects, the integrated device package can include a molding compound disposed over the integrated device die. In some aspects, the laminate substrate further includes a core layer wherein the upper and lower layers are disposed on opposite sides of the core layer. In some aspects, the first and second patterns include one or more insulating layers patterned with a metal. In some aspects, the amount of metal of the upper layer is less than an amount of metal of the lower layer. In some aspects, the laminate substrate panel further includes a cured epoxy material. In some aspects, the upper layer of the laminate substrate panel further includes a patterned solder mask area defining a die pad and configured to support the integrated device die. In some aspects, interconnect is configured to be placed on the integrated device die. In some aspects, the interconnect can include a plurality of solder bumps, a plurality of copper pillars, a plurality of wire bonds, or other interconnect technology. In some aspects, the interconnect is further configured to connect to the die pads of the laminate substrate when the integrated device die is mounted to the laminate substrate.

In some aspects, a method for manufacturing an integrated device package can comprise forming a laminate substrate having an upper layer at or near a top surface of the laminate substrate and a lower layer at or near a bottom surface of the laminate substrate, wherein an opposing layer area density mismatch between the upper and lower layers is greater than 25% of a total area of the laminate substrate; forming an integrated device die; and mounting the integrated device die mount to the laminate substrate.

The method for manufacturing an integrated device package of any of any preceding paragraph and/or any of the methods for manufacturing an integrated device package disclosed herein can include one or more of the following features. In some aspects, the opposing layer area density mismatch between the upper and lower layers can be greater than 30% of a total area of the laminate substrate. In some aspects, the opposing layer area density mismatch between the upper and lower layers can be greater than 35% of a total area of the laminate substrate. In some aspects, the opposing layer area density mismatch between the upper and lower layers can be greater than 40% of a total area of the laminate substrate. In some aspects, the opposing layer area density mismatch between the upper and lower layers can be greater than 45% of a total area of the laminate substrate. In some aspects, the opposing layer area density mismatch between the upper and lower layers can be greater than 50% of a total area of the laminate substrate. In some aspects, the opposing layer area density mismatch between the upper and lower layers can be greater than 60% of a total area of the laminate substrate. In some aspects, the opposing layer area density mismatch between the upper and lower layers can be greater than 70% of a total area of the laminate substrate. In some aspects, the opposing layer area density mismatch between the upper and lower layers can be greater than 80% of a total area of the laminate substrate. In some aspects, the opposing layer area density mismatch between the upper and lower layers can be greater than 90% of a total area of the laminate substrate.

In some aspects, the upper layer of the laminate substrate has a first pattern including a first area of metallization and a first area of insulating material, and the lower layer of the laminate substrate has a second pattern including a second area of metallization and a second area of insulating material In some aspects, the step of mounting the integrated device die to the laminate substrate panel includes: forming a patterned solder mask defining a plurality of bond pads on the upper layer of the laminate substrate panel; connecting the integrated device die with the bond pads of the upper layer of the laminate substrate panel by way of an interconnect; and disposing a molding compound over the integrated device die. In some aspects, the interconnect includes a plurality of solder bumps, a plurality of copper pillars, a plurality of wire bonds, or other interconnect technology.

In some aspects, an integrated device package includes a laminate substrate having an upper layer at or near a top surface of the laminate substrate and a lower layer at or near a bottom surface of the laminate substrate, the upper layer having a first pattern including a first area of metallization and a first area of insulating material, the lower layer having a second pattern including a second area of metallization and a second area of insulating material, wherein at least one of the first and second areas of metallization is less than 50% of a total area of the laminate substrate; and an integrated device die mounted to the laminate substrate.

The integrated device package of any of any preceding paragraphs and/or any of the integrated device packages disclosed herein can include one or more of the following features. In some aspects, at least one of the first and second areas of metallization can be less than 40% of a total area of the laminate substrate. In some aspects, at least one of the first and second areas of metallization can be less than 30% of a total area of the laminate substrate. In some aspects, at least one of the first and second areas of metallization can be less than 20% of a total area of the laminate substrate. In some aspects, at least one of the first and second areas of metallization can be less than 10% of a total area of the laminate substrate.

In some aspects, at least one of the first and second areas of insulating material can be less than 50% of the total area of the laminate substrate. In some aspects, at least one of the first and second areas of insulating material can be less than 40% of the total area of the laminate substrate. In some aspects, at least one of the first and second areas of insulating material can be less than 30% of the total area of the laminate substrate. In some aspects, at least one of the first and second areas of insulating material can be less than 20% of the total area of the laminate substrate. In some aspects, at least one of the first and second areas of insulating material can be less than 10% of the total area of the laminate substrate. In some aspects, the integrated device package can include a molding compound disposed over the integrated device die. In some aspects, the laminate substrate further includes a core layer wherein the upper and lower layers are disposed on opposite sides of the core layer. In some aspects, the first and second patterns include one or more insulating layers patterned with a metal. In some aspects, an amount of metal of the upper layer is less than an amount of metal of the lower layer. In some aspects, the laminate substrate panel further includes a cured epoxy material. In some aspects, the upper layer of the laminate substrate panel further includes a patterned solder mask area defining a die pad and configured to support the integrated device die. In some aspects, an interconnect is configured to enable mounting of the integrated device mount to the laminate substrate panel. In some aspects, the interconnect includes a plurality of solder bumps, a plurality of copper pillars, a plurality of wire bonds, or other interconnect technology. In some aspects, the interconnect is further configured to connect to the die pads of the laminate substrate panel when the integrated device die is mounted to the laminate substrate.

In some aspects, a method for manufacturing an integrated device package can include forming a laminate substrate having an upper layer at or near a top surface of the laminate substrate and a lower layer at or near a bottom surface of the laminate substrate, the upper layer having a first pattern including a first area of metallization and a first area of insulating material, the lower layer having a second pattern including a second area of metallization and a second area of insulating material, wherein at least one of the first and second areas of metallization can be less than 50% of a total area of the laminate substrate; forming an integrated device die; and mounting the integrated device die mount to the laminate substrate.

The method for manufacturing an integrated device package of any of any preceding paragraph and/or any of the methods for manufacturing an integrated device package disclosed herein can include one or more of the following features. In some aspects, at least one of the first and second areas of metallization can be less than 40% of a total area of the laminate substrate. In some aspects, at least one of the first and second areas of metallization can be less than 30% of a total area of the laminate substrate. In some aspects, at least one of the first and second areas of metallization can be less than 20% of a total area of the laminate substrate. In some aspects, at least one of the first and second areas of metallization can be less than 10% of a total area of the laminate substrate.

In some aspects, at least one of the first and second areas of insulating material can be less than 50% of the total area of the laminate substrate. In some aspects, at least one of the first and second areas of insulating material can be less than 40% of the total area of the laminate substrate. In some aspects, at least one of the first and second areas of insulating material can be less than 30% of the total area of the laminate substrate. In some aspects, at least one of the first and second areas of insulating material can be less than 20% of the total area of the laminate substrate. In some aspects, at least one of the first and second areas of insulating material can be less than 10% of the total area of the laminate substrate.

In some aspects, the techniques described herein relate to a method, wherein the step of mounting the integrated device die to the laminate substrate panel includes: forming a patterned solder mask defining a plurality of bond pads on the upper layer of the laminate substrate panel; connecting the integrated device die with the bond pads of the upper layer of the laminate substrate panel by way of an interconnect; and disposing a molding compound over the integrated device die. In some aspects, the interconnect includes a plurality of solder bumps, a plurality of copper pillars, a plurality of wire bonds, or other interconnect technology.

In some aspects, an electronic assembly can include a laminate substrate panel; a plurality of integrated device dies, wherein each integrated device die of the plurality of integrated device dies is mounted to a corresponding functional laminate cell of the array; and a molding compound disposed over the plurality of integrated device dies.

The electronic assembly of any of any preceding paragraphs and/or any of the electronic assemblies disclosed herein can include one or more of the following features. In some aspects, the first and second upper layers further include a patterned solder mask area defining a die pad. In some aspects, an interconnect is positioned on the integrated device die and configured to connect with the bond pad of the laminate substrate panel. In some aspects, an interconnect includes a plurality of solder bumps, a plurality of copper pillars, a plurality of wire bonds, or other interconnect technology.

In some aspects, a method for manufacturing an electronic assembly includes forming a laminate substrate panel including: an upper layer at or near a top surface of the panel; a lower layer at or near a bottom surface of the panel; an array of functional laminate cells, each functional laminate cell of the array having a first upper pattern in the upper layer and a first lower pattern in the lower layer; and forming a dummy laminate cell adjacent the array of functional laminate cells, the dummy laminate cell having a second upper pattern in the upper layer and a second lower pattern in the lower layer, the second upper and lower patterns configured to compensate for at least one of an opposing layer area density mismatch and a material density in at least one of the first upper and lower patterns.

The method for manufacturing an manufacturing an electronic assembly of any of any preceding paragraph and/or any of the methods for manufacturing an electronic assembly disclosed herein can include one or more of the following features. In some aspects, the method includes the step of mounting a plurality of integrated device dies to a corresponding functional laminate cell of the array. In some aspects, the step of mounting the plurality of integrated device dies can include forming a patterned solder mask defining a plurality of bond pads on the upper layers of the laminate substrate panel; and connecting the plurality of integrated device dies with the bond pads of the upper layer of the laminate substrate panel by way of an interconnect. In some aspects, the interconnect includes a plurality of solder bumps, a plurality of copper pillars, a plurality of wire bonds, and/or other interconnect technology.

DETAILED DESCRIPTION

The disclosed embodiments relate to a laminate substrate for systems in package (SiP) containing an array of functional laminate cells to which one or more components are to be mounted and at least one dummy (non-functional) laminate region, and a method for manufacturing the same. In package substrates (e.g., laminate substrates), it can be important to have a sufficiently high material density in various layers of the laminate (e.g., upper and lower layers) and to have sufficient surface area matching between layers (e.g., solder mask or metal layers) on opposite sides of the laminate (referred to herein as "layer matching"). For example, in some embodiments, it can be important to have a sufficiently high metal density in some layers of the laminate. In some embodiments, it can be important to have sufficient surface area matching between insulating layers on opposing sides of the laminate. In some instances, when the material density or layer matching of SiP laminates fall outside desired ranges or bounds, the quality and functionality of the laminates may be negatively affected, which can affect system performance or design parameters. For example, if the material density of a particular layer is too low (e.g., if a metal material density is too low), accuracy in feature resolution may be reduced. Accuracy in feature resolution is a desired feature of laminate substrates for SiP. For example, accuracy in feature resolution allows for consistent trace width and correct shape generation on the laminate substrate. Moreover, if the surface areas of layer material on opposing layers (e.g., opposing upper and lower layers) are too unbalanced, the panel can warp during manufacture due to stress mismatches, making the panel unusable. The opposing layers imbalance can have an insulating material amount imbalance and/or a metal material amount imbalance. The disclosed embodiments address these material density and layer matching issues at the panel level, by patterning a dummy panel cell to have a material density and layer matching that compensates for any density or mismatch issues in the functional laminate cells. Provided that the metal densities and opposing layer balances are maintained within suitable ranges or bounds for the panel as a whole, individual functional laminate cells on the panel can have densities and balances that fall outside the specified ranges. For example, adding a dummy laminate to a panel during the manufacturing process may result in a functional individual laminate cell having a material density and match percentage outside desired design ranges, which is compensated for by patterning the dummy laminate cell(s) accordingly.

Figure 1:
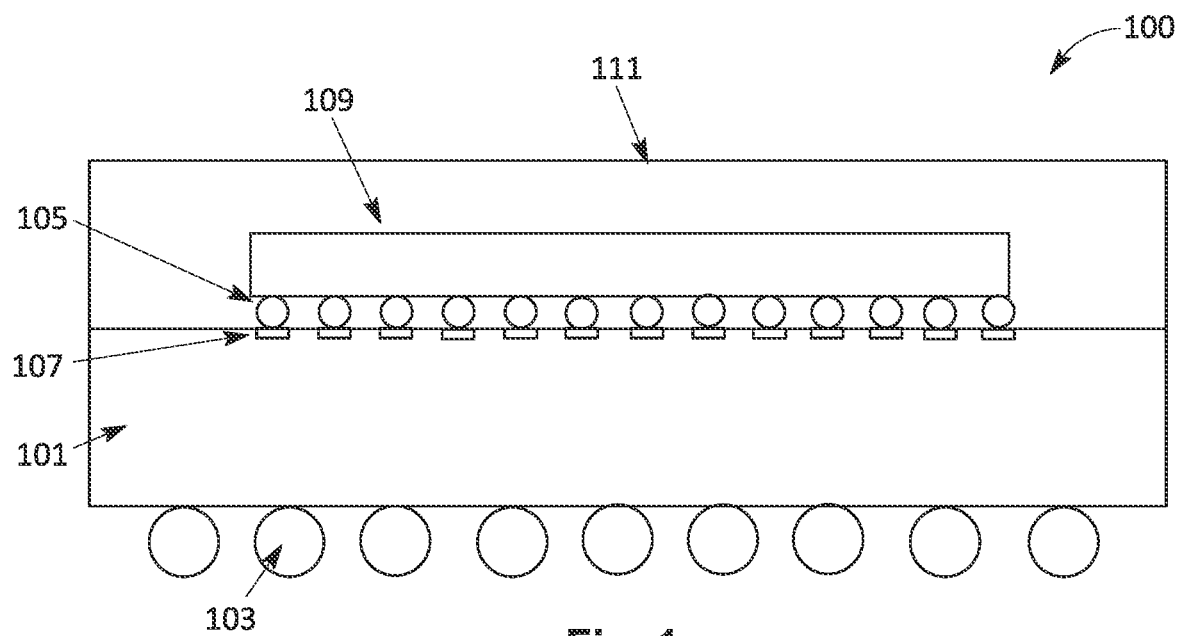
FIG. 1 illustrates an integrated device package according to one embodiment.

FIG. 1 illustrates an integrated device package 100, according to various embodiments. The integrated device package 100 can include a laminate substrate 101 having an upper layer at or near a top surface of the laminate substrate 101 and a lower layer at or near a bottom surface of the laminate substrate 101. As explained below in connection with FIGS. 2-6, the upper layer can have a first pattern including a first area of metallization and a first area of insulating material, the lower layer having a second pattern including a second area of metallization and a second area of insulating material. In various embodiments, a mismatch between the first and second areas of insulating material can be greater than 25% of the total area of the laminate substrate 101. In the illustrated embodiment, at least one of the first or second areas of metallization can be less than 50% of the total area of the laminate substrate 101. In FIG. 1, an integrated device die 109 can be mounted to the laminate substrate 101. The die 109 can include any suitable type of integrated device die, e.g., a processor die, a memory die, a sensor die, etc. The integrated device package 100 can also include a molding compound 111 disposed over the integrated device die 109. Further, the laminate substrate 101 can include a core layer wherein the upper and lower layers are disposed on opposite sides of the core layer (which can include a fiberglass composite, such as FR-4). The upper layers may include any layer positioned on one side of the core layer (e.g., an upper side of the core layer) while the lower layers may include any layer positioned on the opposite side of the core layer (e.g., the lower side of the core layer. The upper and lower patterns can include one or more patterned insulating or metal layers. Also, the amount of metal of the upper layer can be less than an amount of metal of the lower layer, or vice versa. The one or more insulating layers of the upper patterns can include a solder mask layer with openings defining a metallic bond pad 107. The one or more insulating layers of the lower pattern can include a solder mask layer exposing terminals to be connected to solder balls 103, which can be connected to a system board (not shown). The upper layer of the laminate substrate panel can also include a patterned solder mask area defining a die pad region sized to accommodate the footprint of the die and configured to support the integrated device die 109. The integrated device package 100 can also incorporate an interconnect 105 positioned along a surface of the integrated device die 109 and configured to connect with the bond pads 107 of the laminate substrate. The interconnect can include a plurality of solder bumps, a plurality of copper pillars, a plurality of wire bonds, or another interconnect technology.

Although the material density and layer matching of a dummy panel cell can be used to compensate for any density or mismatch issues of uppermost and lowermost layers (e.g., opposing layer density mismatch), such as the external layers of a laminate substrate panel, a dummy panel cell can also be used to compensate for any density or mismatch issues of any internal layers of the laminate substrate panel.

Figure 2:
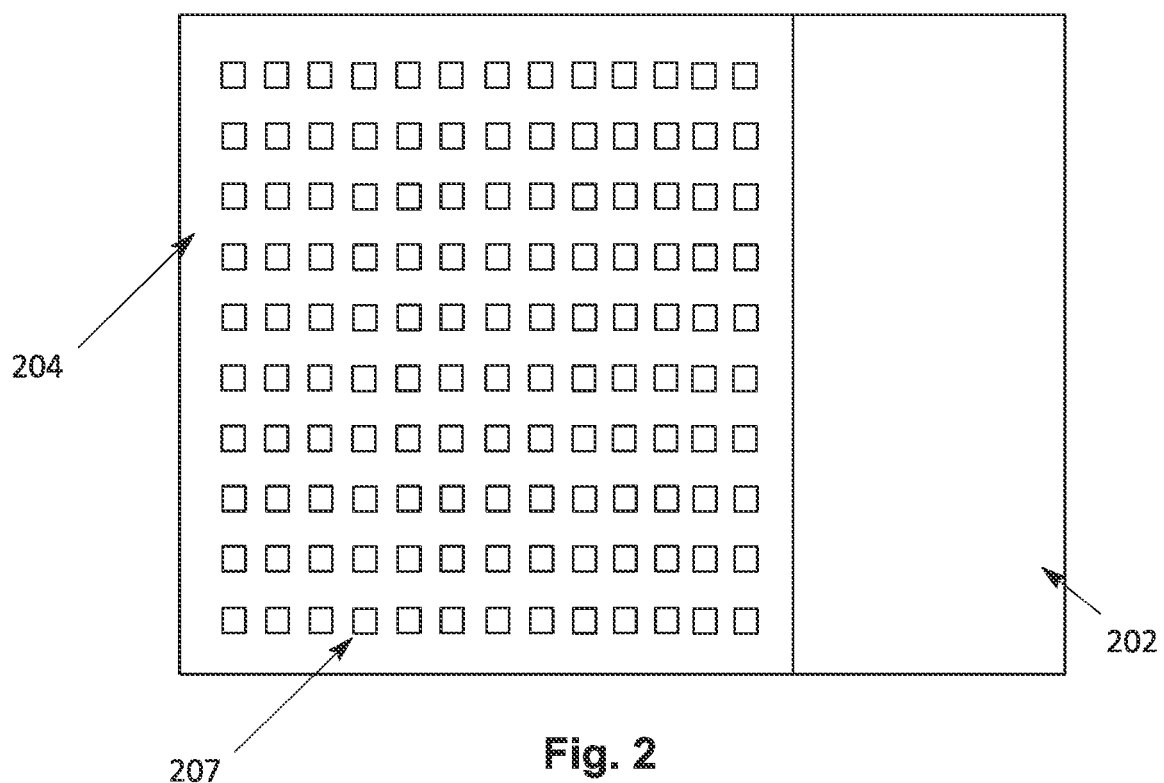
FIG. 2 illustrates a laminate cell according to one embodiment.

One embodiment disclosed herein can include a section of a laminate substrate panel as shown in FIG. 2. The laminate substrate panel 200 can include an upper layer at or near a top surface of the panel; a lower layer at or near a bottom surface of the panel; an array of laminate cells, each laminate cell of the array having a first upper pattern in the upper layer and a first lower pattern in the lower layer; and a dummy laminate cell 202 adjacent the array of laminates. FIG. 2 shows an array of laminate cells having a single functional laminate cell 204. A full panel can include one or more (e.g., two, three, four, six, eight, ten, etc.) substrate panels 200 shown in FIG. 2 and include various combinations of dummy laminate cells 202 and functional laminate cells 204 (e.g., two functional cells and one dummy cell, three functional cells and one dummy cell, six functional cells and two dummy cells, eight functional cells and four dummy cells, etc.). The upper and lower layers can be uppermost and lowermost layers. Alternatively, the upper and lower layers can be any set of layers closer to the top or bottom surfaces than the other. The dummy laminate cell 202 can have a second upper pattern in the upper layer and a second lower pattern in the lower layer, and the second upper and lower patterns can be configured to compensate for at least one of a material (e.g., a metallic or insulating material) opposing layer density mismatch and a low material (e.g., a metallic or insulating material) density in at least one of the first upper and lower patterns. A dummy laminate cell 202 can be characterized as a nonfunctional or unused cell. That is, dummy cells are configured to, as previously disclosed, compensate for at least one of a opposing layer density material (e.g., a metallic or insulating material) mismatch and a low material (e.g., a metallic or insulating material) density in at least one of the first upper and lower patterns of each laminate cell of the array. Dummy cells can be removed and discarded from the laminate substrate panel 200. Further, dummy cells are not incorporated into, for example, a SiP after they are removed and discarded. Each laminate cell of the array can be singulated, or separated, from the laminate substrate panel 200 and function as a package substrate to which a die and other electronic components can be mounted. In some cases, the die and/or the other electronic components can be mounted to the substrate panel 200 before singulation. The one or more insulating layers of the first and second upper patterns can include a solder mask layer with openings defining a plurality of bond pads 207. In some cases, the plurality of bond pads 207 can be defined by a patterned solder mask of the laminate substrate panel 200. The plurality of bond pads 207 can be sized to accommodate the footprint of the die and configured to support an integrated device die.

Figure 3:
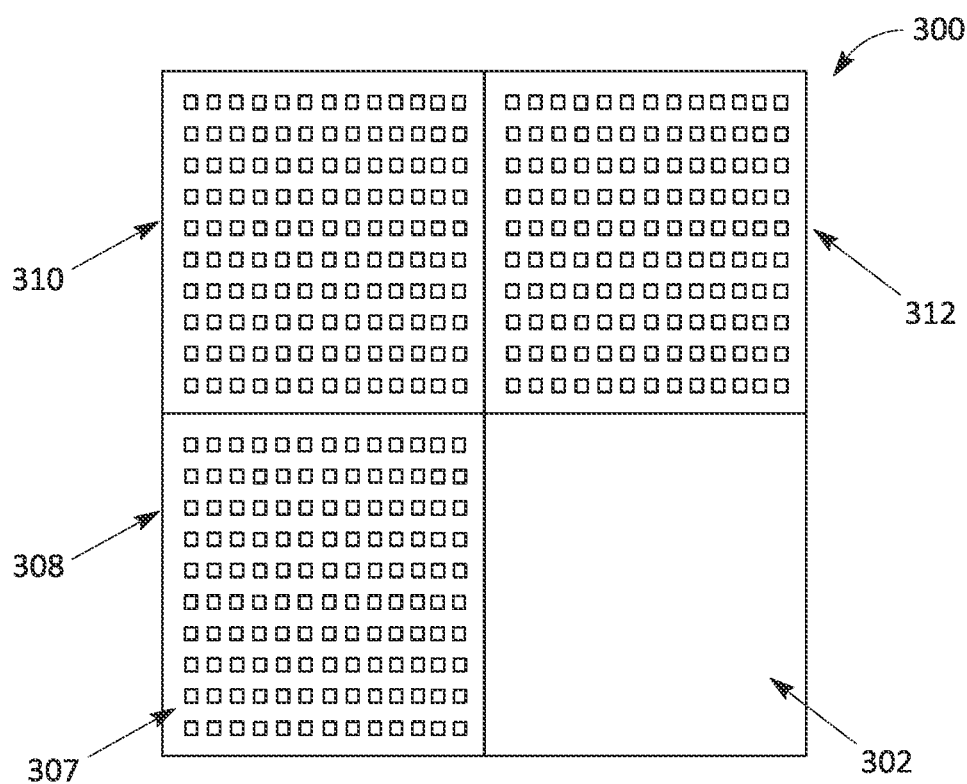
FIG. 3 illustrates a laminate substrate panel according to another embodiment.

In one embodiment, the laminate substrate panel can include a plurality of laminate cells for every dummy laminate cell. For example, FIG. 2 shows one embodiment of a laminate substrate panel 200 having an array of laminate cells having a single laminate cell 204, and a single dummy laminate cell 202. As another example, FIG. 3 shows another embodiment of a laminate substrate panel 300 having an array of laminate cells having three functional laminate cells 308, 310, 312 and a single dummy laminate cell 302. However, a laminate substrate panel can include different combinations of individual laminate cells and dummy cells. For example, a laminate substrate panel can include two individual laminate cells and a single dummy laminate cell; three individual laminate cells and a single dummy laminate cell; four individual laminate cells and a single dummy laminate cell; five individual laminate cells and a single dummy laminate cell; seven individual laminate cells and a single dummy laminate cell; seven individual laminate cells and two dummy laminate cells; thirteen individual laminate cells and three dummy laminate cells; or any suitable combination of individual laminate cells and dummy laminate cells. Also, an individual laminate cell and a single dummy laminate cell can be of substantially the same size.

Another embodiment disclosed herein includes a laminate substrate panel 300 as shown in FIG. 3. The laminate substrate panel 300 can include an upper layer at or near a top surface of the panel; a lower layer at or near a bottom surface of the panel; an array of laminate cells, each laminate cell of the array having a first upper pattern in the upper layer and a first lower pattern in the lower layer; and a dummy laminate cell 302 adjacent the array of laminates. FIG. 3 shows an array of laminate cells having three individual laminate cells 308, 310, 312. The upper and lower layers can be uppermost and lowermost layers. Alternatively, the upper and lower layers can be any set of layers closer to the top or bottom surfaces than the other. The dummy laminate cell 302 can have a second upper pattern in the upper layer and a second lower pattern in the lower layer, and the second upper and lower patterns can be configured to compensate for at least one of a material mismatch and a material density in at least one of the first upper and lower patterns. A dummy laminate cell 302 can be characterized as a nonfunctional or unused cell. That is, dummy cells can be configured to, as previously disclosed, compensate for at least one of a material mismatch and a material density in at least one of the first upper and lower patterns of each laminate cell of the array. Dummy cells are typically removed and discarded from the laminate substrate panel 300. Further, dummy cells may not be incorporated into, for example, a SiP, after they are removed and discarded. Each laminate cell of the array can be singulated, or separated, from the laminate substrate panel 300 and function as a package substrate to which a die and other electronic components can be mounted. In some cases, the die and/or the other electronic components can be mounted to the laminate substrate panel 300 before singulation. The one or more insulating layers of the first and second upper patterns can include a solder mask layer with openings defining a plurality of bond pads 307. The plurality of bond pads 307 is defined by a patterned solder mask of the laminate substrate panel 300. The plurality of bond pads 307 can be arranged to receive an interconnect, such as interconnect 105 shown in FIG. 1. The interconnect can be disposed along an integrated device, such as integrated device 109 in FIG. 1, and facilitate connection of the laminate substrate panel 300 to the integrated device via the plurality of bond pads 307. In some cases, the interconnect includes a ball grid array (BGA) configuration.

Figure 4:
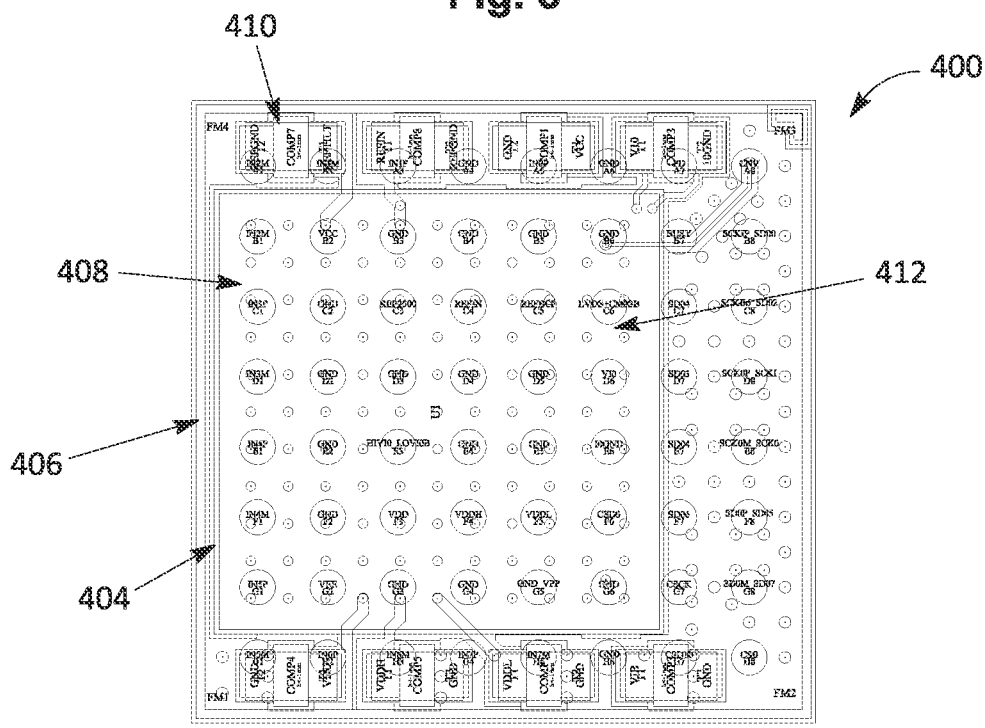
FIG. 4 is a top-down diagram of a laminate substrate panel cell, showing an upper layer of the laminate overlaid with a lower layer of the laminate.
Figure 5:
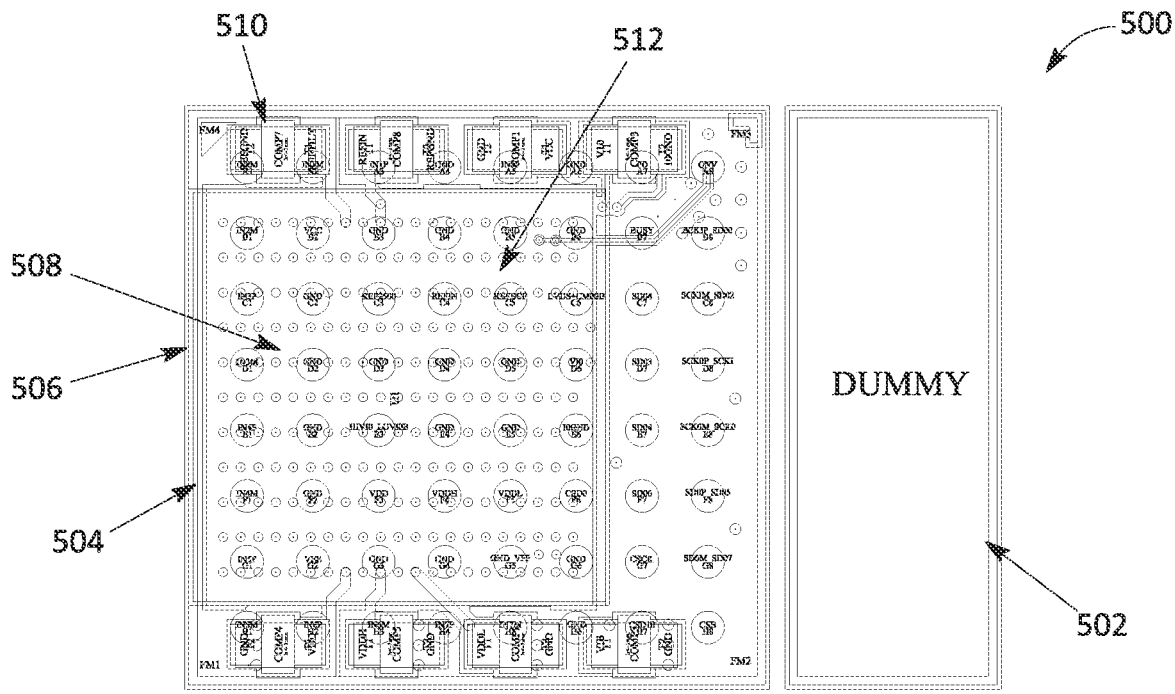
FIG. 5 is a diagram of a laminate substrate panel including the cell of FIG. 4 and a dummy laminate cell, according to one embodiment.
Figure 6:
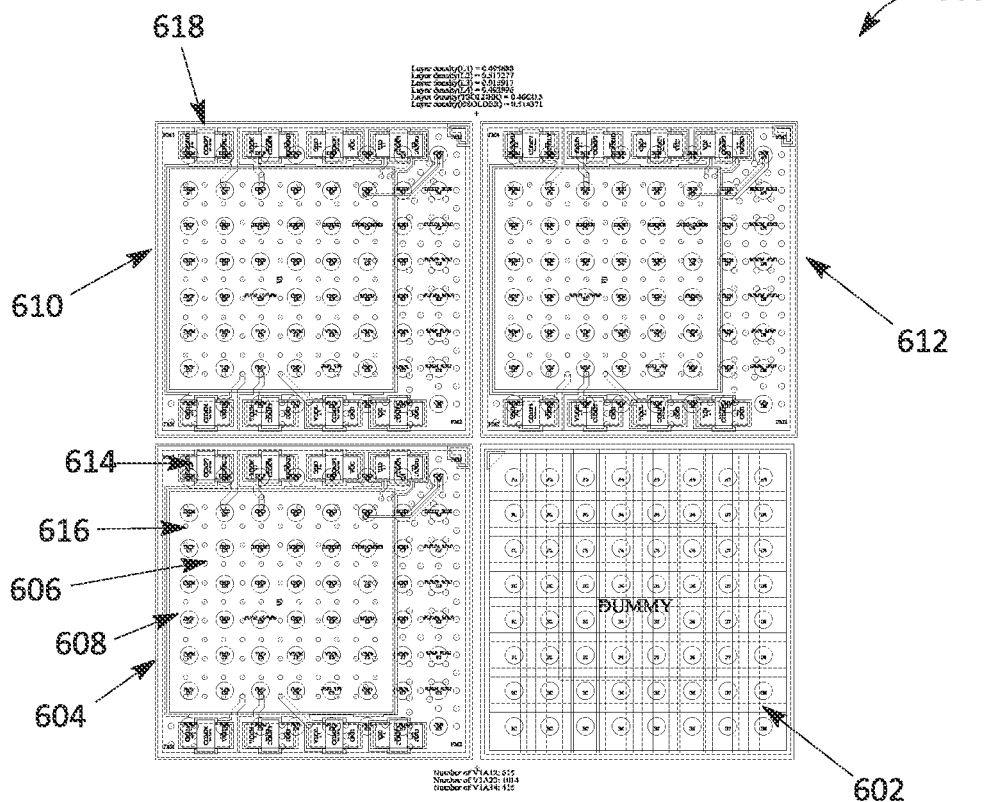
FIG. 6 is a diagram of a laminate substrate panel according to another embodiment.

FIG. 4 is a diagram of a laminate substrate panel 400. FIG. 4 illustrates both the top and bottom layers of a laminate substrate panel. The top and bottom layers in FIGS. 4-6 are overlaid on one another; the top layer is illustrated as being partially transparent. FIG. 4 shows the substrate panel 400 without a dummy laminate panel. The laminate substrate panel 400 can include a die pad 406. The die pad 406 can be defined by a patterned solder mask of the laminate substrate panel 400. The die pad 406 can be sized to accommodate the footprint of the die and configured to support the integrated device die. The laminate substrate panel 400 can include a plurality of terminals 408 for solder balls. The solder balls can facilitate the attachment of the integrated device package into another component, e.g., for electrically connecting the laminate to a system board. The laminate substrate panel 400 can also include a bond pad 412 for an interconnect. The interconnect can electrically connect an integrated device die to the laminate substrate panel 400. Mounting the integrated device die to the laminate substrate panel 400 can include connecting the interconnect with the bond pad 412 of the laminate substrate panel 400 and disposing a molding compound over the integrated device die. The interconnect can include a plurality of solder bumps, a plurality of copper pillars, a plurality of wire bonds, or another interconnect technology. The laminate substrate panel 400 can also include a plurality of capacitors and/or passive pads 410.

FIG. 5 is a diagram of a laminate substrate panel 500 having a single dummy cell 502 and an array of laminate cells having one functional laminate cell 504. It should be appreciated that any suitable number of functional laminate cells 504 may be provided per dummy cell 502. For example, a laminate substrate panel can include two individual laminate cells and a single dummy laminate cell; three individual laminate cells and a single dummy laminate cell; four individual laminate cells and a single dummy laminate cell; five individual laminate cells and a single dummy laminate cell; seven individual laminate cells and a single dummy laminate cell; seven individual laminate cells and two dummy laminate cells; thirteen individual laminate cells and three dummy laminate cells; or any suitable combination of individual laminate cells and dummy laminate cells. FIG. 5 also shows a die pad 506. The die pad 506 is defined by a patterned solder mask of the laminate substrate panel 500. The die pad 506 can be sized to accommodate the footprint of the die and configured to support the integrated device die. The laminate substrate panel 500 can include a plurality of terminals 508 for solder balls. The solder balls can facilitate the attachment of the integrated device package into another component. The component can include, for example, a system board. The laminate substrate panel 500 can also include a bond pad 512 for an interconnect. The interconnect can facilitate mounting of an integrated device die to the laminate substrate panel 500. Mounting the integrated device die to the laminate substrate panel 500 can include connecting the interconnect with the bond pad 512 of the laminate substrate panel 500 and disposing a molding compound over the integrated device die. The interconnect can include a plurality of solder bumps, a plurality of copper pillars, a plurality of wire bonds, or another interconnect technology. Other active and passive devices such as capacitors, inductors, resistors, MOSFETS, diodes, etc. may also be mounted to the laminate substrate panel 500. For example, a plurality of capacitors 510 may be mounted to the laminate substrate panel as shown in FIG. 5.

FIG. 6 is a diagram view of a laminate substrate panel 600 having a single dummy cell 602 and an array of laminate cells having three individual laminate cells 608, 610, 612. It should be appreciated that any suitable number of functional laminate cells 608, 610, 612 may be provided per dummy cell. For example, a laminate substrate panel can include two individual laminate cells and a single dummy laminate cell; three individual laminate cells and a single dummy laminate cell; four individual laminate cells and a single dummy laminate cell; five individual laminate cells and a single dummy laminate cell; seven individual laminate cells and a single dummy laminate cell; seven individual laminate cells and two dummy laminate cells; thirteen individual laminate cells and three dummy laminate cells; or any suitable combination of individual laminate cells and dummy laminate cells. FIG. 6 also shows a die pad 604. The die pad 604 is defined by a patterned solder mask of the laminate substrate panel 600. The die pad 604 can be sized to accommodate the footprint of the die and configured to support the integrated device die. The laminate substrate panel 600 can include a plurality of terminals 606 for solder balls. The solder balls can facilitate the attachment of the integrated device package into another component. The component can include, for example, a system board. The laminate substrate panel 600 can also include a bond pad 616 for an interconnect. The interconnect can facilitate mounting of an integrated device die to the laminate substrate panel 600. Mounting the integrated device die to the laminate substrate panel 600 can include connecting the interconnect with the bond pad 616 of the laminate substrate panel 600 and disposing a molding compound over the integrated device die. The interconnect can include a plurality of solder bumps, a plurality of copper pillars, a plurality of wire bonds, or another interconnect technology. The laminate substrate panel can also include a plurality of capacitors and/or passive pads 618.

The surface area layer mismatch between upper and lower layers of the functional laminate cells can be greater than 25%, 30%, 35%, 40%, 45%, 50%, 60%, 70% 80%, or 90% of a total area of the laminate substrate. The surface area layer mismatch between upper and lower layers of the functional laminate cells can be between 25% and 100%, between 30% and 100%, between 35% and 100%, between 40% and 100%, between 45% and 100%, between 50% and 100%, between 55% and 100%, between 60% and 100%, between 65% and 100%, between 70% and 100%, between 75% and 100%, between 80% and 100%, between 85% and 100%, between 90% and 100%, or between 95% and 100% of a total area of the laminate substrate.

The material density in at least one of the first upper and lower patterns of the functional laminate cells can be less than 10%, 20%, 30%, 40%, or 50%. The material density in at least one of the first upper and lower patterns can be between 0% and 5%, between 0% and 10%, between 0% and 15%, between 0% and 20%, between 0% and 25%, between 0% and 30%, between 0% and 35%, between 0% and 40%, between 0% and 45%, or between 0% and 50%.

As explained above, the significant density mismatching between upper and lower layer materials (e.g., a metallic or insulating material) and/or the low material (e.g., a metallic or insulating material) density can cause warpage in the substrate and can reduce resolution of patterned features. Beneficially, the laminate cells disclosed herein can be patterned to compensate for the mismatches and low material density (e.g., low metal density or low insulating material density within a particular layer or layers). For example, in the functional cells, the upper layer may have a higher surface area of insulating material as compared to the lower layer. To compensate for the high surface area of insulating material in the upper layer of the functional cells, in the dummy cell(s), the lower layer may be provided with a higher surface area of insulating material (or vice versa). By contrast, if the functional cells were to have a lower surface area of insulating material in the upper layer as compared to the lower layer, then the dummy cell(s) can have a higher surface area of insulating material in the upper layer than the lower layer. As another example, in the functional cells, the upper layer may have a higher surface area of metallic material as compared to the lower layer. To compensate for the high surface area of metallic material in the upper layer of the functional cells, in the dummy cell(s), the lower layer may be provided with a higher surface area of metallic material (or vice versa). By contrast, if the functional cells were to have a lower surface area of metallic material in the upper layer as compared to the lower layer, then the dummy cell(s) can have a higher surface area of metallic material in the upper layer than the lower layer. To compensate for the low metal density in the upper layer (or vice versa), the dummy cell can include higher metal density in the upper layer (or vice versa). Accordingly, in various embodiments, the second upper and lower patterns of the dummy cell can be configured to compensate for at least one of (e.g., both) a material (e.g., a metallic or insulating material) mismatch and a material (e.g., a metallic or insulating material) density in at least one of the first upper and lower patterns of functional cells. Although the material density and layer matching of a dummy panel cell can be used to compensate for any density or mismatch issues of the uppermost and lowermost layers of the laminate substrate panel, such as the external layers of a laminate substrate panel, a dummy panel cell can also be used to compensate for any density or mismatch issues of any internal layers of the laminate substrate panel. The internal layers can include any layer positioned between the uppermost and lowermost layers of the laminate substrate panel.

A method for manufacturing a laminate substrate panel is also disclosed herein. The method can include forming an upper layer on an upper side of a core layer; forming a lower layer on a lower side of the core layer; forming an array of laminate cells, wherein each laminate cell of the array can include a first upper pattern in the upper layer and a first lower pattern in the lower layer; and forming a dummy laminate cell adjacent the array of laminates. The dummy laminate cell can include a second upper pattern in the upper layer and a second lower pattern in the lower layer, the second upper and lower patterns configured to compensate for at least one of a material mismatch and a material density in at least one of the first upper and lower patterns. The laminate substrate panel can be made of a cured epoxy material. The step of forming an array of laminate cells and a dummy laminate cell can include forming at least three laminate cells for every dummy laminate cell. However, it should be appreciated that any suitable number of functional laminate cells may be provided per dummy cell. For example, a laminate substrate panel can include two individual laminate cells and a single dummy laminate cell; three individual laminate cells and a single dummy laminate cell; four individual laminate cells and a single dummy laminate cell; five individual laminate cells and a single dummy laminate cell; seven individual laminate cells and a single dummy laminate cell; seven individual laminate cells and two dummy laminate cells; thirteen individual laminate cells and three dummy laminate cells; or any suitable combination of individual laminate cells and dummy laminate cells.

The method for manufacturing a laminate substrate panel can also include the step of mounting an integrated device die to the laminate substrate panel. Such step can include forming a patterned solder mask defining a plurality of bond pads on the first and second upper layers of the laminate substrate panel; positioning an interconnect on the integrated device die; connecting interconnect with the plurality of bond pads of the first and second upper layers of the laminate substrate panel; and disposing a molding compound over the integrated device die. The interconnect can include a plurality of solder bumps, a plurality of copper pillars, a plurality of wire bonds, or other interconnect technology.

Also disclosed herein is a method for manufacturing an integrated device package. The method can include forming a laminate substrate, forming an integrated device die, and mounting the integrated device die to the laminate substrate. The laminate substrate can have an upper layer at or near a top surface of the laminate substrate and a lower layer at or near a bottom surface of the laminate substrate, the upper layer having a first pattern including a first area of metallization and a first area of insulating material, the lower layer having a second pattern including a second area of metallization and a second area of insulating material, wherein a mismatch between the first and second areas of insulating material is greater than 25% of a total area of the laminate substrate, and wherein at least one of the first and second areas of metallization is less than 50%. The step of mounting the integrated device die to the laminate substrate can include forming a patterned solder mask defining a plurality of bond pads on the first and second upper layers of the laminate substrate panel; connecting the integrated device die with the bond pads of the upper layer of the laminate substrate panel by way of an interconnect; and disposing a molding compound over the integrated device die. The interconnect can include a plurality of solder bumps, a plurality of copper pillars, a plurality of wire bonds, or other interconnect technology.

Another embodiment disclosed herein includes an electronic assembly. The electronic assembly can include a laminate substrate panel, a plurality of integrated device dies, and a molding compound disposed over each integrated device die. In one embodiment, the plurality of integrated device dies can be mounted to a corresponding laminate cell of the array. The laminate substrate panel can include an upper layer with a patterned solder mask area defining a die pad. An interconnect can be positioned over the plurality of integrated device dies to connect the plurality of integrated device dies with the die pad of the laminate substrate panel.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A laminate substrate panel comprising:
    an upper layer at or near a top surface of the panel;
    a lower layer at or near a bottom surface of the panel;
    an array of functional laminate cells, each functional laminate cell of the array having a first upper pattern in the upper layer and a first lower pattern in the lower layer; and
    a dummy laminate cell adjacent the array of functional laminate cells, the dummy laminate cell having a second upper pattern in the upper layer and a second lower pattern in the lower layer, the second upper and lower patterns configured to compensate for at least one of an opposing layer area density mismatch and a material density in at least one of the first upper and lower patterns.

2. The laminate substrate panel of claim 1, further comprising a core layer wherein the first and second upper and lower layers are disposed on opposite sides of the core layer.

3. The laminate substrate panel of claim 2, wherein the first and second upper and lower patterns include one or more patterned insulating or metal layers.

4. The laminate substrate panel of claim 2, wherein an amount of material of the first upper layer is less than an amount of material of the first lower layer.

5. The laminate substrate panel of claim 2, wherein an amount of metal of the first upper layer is less than an amount of metal of the first lower layer.

6. The laminate substrate panel of claim 2, wherein an amount of insulating material of the first upper layer is less than an amount of insulating material of the first lower layer.

7. The laminate substrate of claim 4, wherein an amount of metal of the second upper layer is greater than an amount of metal of the second lower layer.

8. The laminate substrate panel of claim 3, wherein the one or more insulating layers of the first and second upper patterns comprises a solder mask layer with openings defining a die pad.

9. The laminate substrate panel of claim 3, wherein the one or more insulating layers of the first and second lower patterns comprise a solder mask layer exposing terminals to connect to solder balls.

10. The panel of claim 1, wherein a number of functional cells of the array is greater than a number of dummy laminate cells.

11. The panel of claim 1, wherein the opposing layer area density mismatch between the first upper and lower patterns is between 25% and 100% of a total area of the laminate substrate.

12. The panel of claim 1, wherein the material density in at least one of the first upper and lower patterns is less than 50%.

13. A method for manufacturing a laminate substrate panel, the method comprising:
    forming an upper layer on an upper side of a core layer;
    forming a lower layer on a lower side of the core layer;
    forming an array of functional laminate cells, each functional laminate cell of the array having a first upper pattern in the upper layer and a first lower pattern in the lower layer; and
    forming a dummy laminate cell adjacent the array of functional laminate cells, the dummy laminate cell having a second upper pattern in the upper layer and a second lower pattern in the lower layer, the second upper and lower patterns configured to compensate for at least one of an opposing layer area density mismatch and a material density in at least one of the first upper and lower patterns.

14. The method of claim 13, wherein the steps of forming an array of functional laminate cells and a dummy laminate cell comprise forming at least three functional laminate cells for every dummy laminate cell.

15. The method of claim 13, wherein a number of functional laminate cells of the array is greater than a number of dummy laminate cells.

16. The method of claim 13, wherein the method further comprises mounting an integrated device die to the laminate substrate panel.

17. The method of claim 16, wherein the step of mounting the integrated device die to the laminate substrate panel comprises:
    forming a patterned solder mask defining a plurality of bond pads on the first and second upper layers of the laminate substrate panel;
    connecting the integrated device die with the bond pads of the upper layer of the laminate substrate panel by way of an interconnect; and
    disposing a molding compound over the integrated device die.

18. A method for manufacturing an integrated device package, the method comprising:
    forming a laminate substrate having an upper layer at or near a top surface of the laminate substrate and a lower layer at or near a bottom surface of the laminate substrate, wherein an opposing layer area density mismatch between the upper and lower layers is greater than 25% of a total area of the laminate substrate;
    forming an integrated device die; and
    mounting the integrated device die mount to the laminate substrate.

19. The method of claim 18, wherein the step of mounting the integrated device die to the laminate substrate panel comprises:
    forming a patterned solder mask defining a plurality of bond pads on the upper layer of the laminate substrate panel;
    connecting the integrated device die with the bond pads of the upper layer of the laminate substrate panel by way of an interconnect; and
    disposing a molding compound over the integrated device die.

20. The method of claim 19, wherein the interconnect comprises a plurality of solder bumps, a plurality of copper pillars, a plurality of wire bonds, or other interconnect technology.

* * * * *

UNITED STATES PATENT AND TRADEMARK OFFICE
CERTIFICATE OF CORRECTION

| | |
|---|---|
| PATENT NO. | : 12,374,633 B2 |
| APPLICATION NO. | : 18/059916 |
| DATED | : July 29, 2025 |
| INVENTOR(S) | : Clement Joseph Wagner |

It is certified that error appears in the above-identified patent and that said Letters Patent is hereby corrected as shown below:

In the Specification

Column 5, Line 25, delete "20%. the material" and insert -- 20%. The material --.

Column 6, Line 11, delete "laminate substrate In" and insert -- laminate substrate. In --.

Column 7, Line 21, delete "insulating material In" and insert -- insulating material. In --.

Column 9, Line 40, delete "for manufacturing an manufacturing an electronic" and insert -- for manufacturing an electronic --.

Signed and Sealed this
Eleventh Day of November, 2025

John A. Squires
*Director of the United States Patent and Trademark Office*